United States Patent
Ogasawara (10) Patent No.: US 6,229,355 B1
(45) Date of Patent: May 8, 2001

(54) SWITCHING DEVICE FOR SUPPRESSING A RUSH CURRENT

(75) Inventor: Kazuyoshi Ogasawara, Susono (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/514,333

(22) Filed: Feb. 28, 2000

(30) Foreign Application Priority Data

| Feb. 26, 1999 | (JP) | .................................................. | 11-049887 |
| Jan. 26, 2000 | (JP) | .................................................. | 12-016804 |

(51) Int. Cl.[7] .................................................. H03K 3/00
(52) U.S. Cl. .................... 327/108; 327/310; 327/321; 361/56; 326/85; 326/87
(58) Field of Search ............................ 327/108–112, 205, 327/206, 436, 437, 309, 310, 318, 321, 331; 361/56; 326/85, 87

(56) References Cited

U.S. PATENT DOCUMENTS

| 5,361,008 | 11/1994 | Saijo | ..................................... 327/427 |
| 5,565,802 | * 10/1996 | Kohno | ..................................... 327/205 |

FOREIGN PATENT DOCUMENTS

| 1-1227520 | 9/1989 | (JP) . |
| 2-266836 | 10/1990 | (JP) . |
| 3-262209 | 11/1991 | (JP) . |
| 4-134271 | 5/1992 | (JP) . |
| 5-52880 | 3/1993 | (JP) . |
| 6-27157 | 2/1994 | (JP) . |
| 6-61432 | 3/1994 | (JP) . |
| 6-188704 | 7/1994 | (JP) . |
| 6-244414 | 9/1994 | (JP) . |
| 6-244693 | 9/1994 | (JP) . |
| 9-145749 | 6/1997 | (JP) . |

* cited by examiner

Primary Examiner—Kenneth B. Wells
(74) Attorney, Agent, or Firm—Sughrue, Mion, Zinn, Macpeak & Seas, PLLC (57) ABSTRACT

A switching device includes a phase controlling circuit (801) which shifts and outputs a phase of a command signal, and a plurality of switching units (110) connected in parallel between a power supply (101) and a load (102). Each of the plurality of switching units (110) includes a driving circuit (111) which outputs a drive signal in response to the command signal from the phase controlling circuit (801), a first semiconductor switch (QA) inserted in a power supply circuit connecting the power supply (101) and the load (102), and adapted to conduct in response to the drive signal and close the power supply circuit, a resistor (Rr1) connected to the power supply (101) to form a shunt circuit, a second semiconductor switch (QB) inserted in the shunt circuit, and adapted to conduct in response to the drive signal and close the shunt circuit, and a comparator (CMP1) which compares an output voltage from the first semiconductor switch (QA) and an output voltage from the second semiconductor switch (QB), and stops the driving circuit (111) from outputting the drive signal when the output voltage from the second semiconductor switch (QB) is higher than the output voltage from the first semiconductor switch (QA).

1 Claim, 5 Drawing Sheets

SWITCHING DEVICE FOR SUPPRESSING A RUSH CURRENT

BACKGROUND OF THE INVENTION

1. Field of the Invention

The present invention relates to a switching device for controlling the supply of electric power from a power supply to a load. More particularly, the present invention relates to a switching device for controlling a rush current at the time of starting or stopping the driving of the load.

The present application is based on Japanese Patent Applications Nos. Hei. 11-49887 and 2000-16804, which are incorporated herein by reference.

2. Description of the Related Art

A switching device is used for controlling the supply of electric power from a power supply to each load in, for example, an automobile, and is comprised of a semiconductor switch for effecting a changeover between the supply and cutoff of electric power, a controlling device for effecting on/off control of the semiconductor switch, etc. In such a switching device, when the semiconductor switch is turned on and the current begins to flow, there are cases where a rush current which is larger than the normal current necessary for driving the load occurs in the manner of a pulse. This rush current constitutes causes of faults in the load such as by generating noise and shortening the service life.

To suppress such a rush current, the related switching device employs a controlling device such as a microcomputer to effect the duty control of the drive signal waveform during the starting and stopping of the load driving.

With the above-described switching circuit, however, the microcomputer and the like become necessary as the controlling device for suppressing the rush current, so that there is a problem in that the device becomes complex.

SUMMARY OF THE INVENTION

It is an object of the present invention to provide a switching device which is simplified, thereby overcoming the above-described drawback of the above related art.

To this end, in accordance with the present invention, there is provided a switching device which comprises a phase controlling device which shifts and outputs a phase of a command signal, and a plurality of switching units connected in parallel between a power supply and a load, each of the plurality of switching units including a driving device which outputs a drive signal in response to the command signal from the phase controlling device, a first semiconductor switch inserted in a power supply circuit connecting the power supply and the load, the first semiconductor switch being adapted to conduct in response to the drive signal and close the power supply circuit, a resistor connected to the power supply to form a shunt circuit, a second semiconductor switch inserted in the shunt circuit, the second semiconductor switch being adapted to conduct in response to the drive signal and close the shunt circuit, and a drive stopping device which compares an output voltage from the first semiconductor switch and an output voltage from the second semiconductor switch, and stops the driving device from outputting the drive signal when the output voltage from the second semiconductor switch is higher than the output voltage from the first semiconductor switch.

The resistor upon receiving the supply of current from the power supply generates an output voltage of the second semiconductor switch which is substantially equal to or lower than the output voltage from the first semiconductor switch persisting when all the plurality of semiconductor switches are supplying current to the load.

If the switching device is thus configured, the command signal is converted to command signals having different phases by the phase controlling device, and the respective switching units are consecutively turned on by the command signals having different phases, and begin to supply power to the load. The switching unit, which first received the drive command signal, begins to supply current from the power supply to the load when the driving device outputs the drive signal to the first semiconductor switch to set the first semiconductor switch in a conducting state. At this time, since the output voltage from the second semiconductor switch is higher than the output voltage from the first semiconductor, the drive stopping device stops the drive circuit from outputting the drive signal. As the output of the drive signal is stopped, the first semiconductor switch is set in a nonconducting state, so that the supply of current from the power supply to the load is stopped. Subsequently, when the output voltage from the first semiconductor switch and the output voltage from the second semiconductor switch drop to a substantially equal level, the drive stopping device causes the driving device to output the drive signal again, thereby allowing the first semiconductor switch to conduct and supplying the current to the load. As the outputting and stopping of the drive signal are repeated in the above-described manner, the first semiconductor switch periodically repeats conduction and nonconduction, so that the state becomes similar to that of duty control, and the current which is supplied at this time becomes smaller than the steady-state current. The respective switching units are consecutively made to conduct to effect similar operation. Subsequently, when the output voltage from the second semiconductor switch has become substantially equal to or lower than the output voltage from the first semiconductor switch, each switching unit stops the repetition of conduction and nonconduction of the first semiconductor switch, and is kept in the conducting state, so that the steady-state -current flows to the load. For this reason, the current increases in steps at the time of starting the driving of the load. On the other hand, when the driving of the load is stopped, since command signals for stopping the driving of the load are consecutively inputted to the respective switching units, when the first switching unit is set in the nonconducting state, the respective switching units are consecutively set in the nonconducting state while performing the repetition of the conduction and nonconduction of the first semiconductor switch in the same way as described above, so that the current at the time of stopping the load decreases in steps. In other words, the state becomes similar to that of duty control at the time of starting or stopping the driving of the load, and the current flowing across the load is increased or decreased in steps, so that it is possible to suppress the rush current. Thus, it is possible to suppress the rush current by hardware circuits alone without using a microcomputer as the controlling device. Further, most of the component elements such as the hardware circuits making up the switching device can be integrated on a single semiconductor chip. In short, the switching device can be simplified.

The above and other objects, features and advantages of the present invention will become more apparent from the following detailed description of the present invention when read in conjunction with the accompanying drawings.

DETAILED DESCRIPTION OF THE PREFERRED EMBODIMENTS

First, before giving a detailed description of an embodiment of the present invention, with reference to FIGS. 1 to 3 a description will be given of the basic configuration and basic operation of a switching device with a current-oscillating type circuit-breaking function in accordance with the present invention as well as an outline of control in a case where an abnormal current such as an overcurrent or an undercurrent has occurred.

Figure 1:
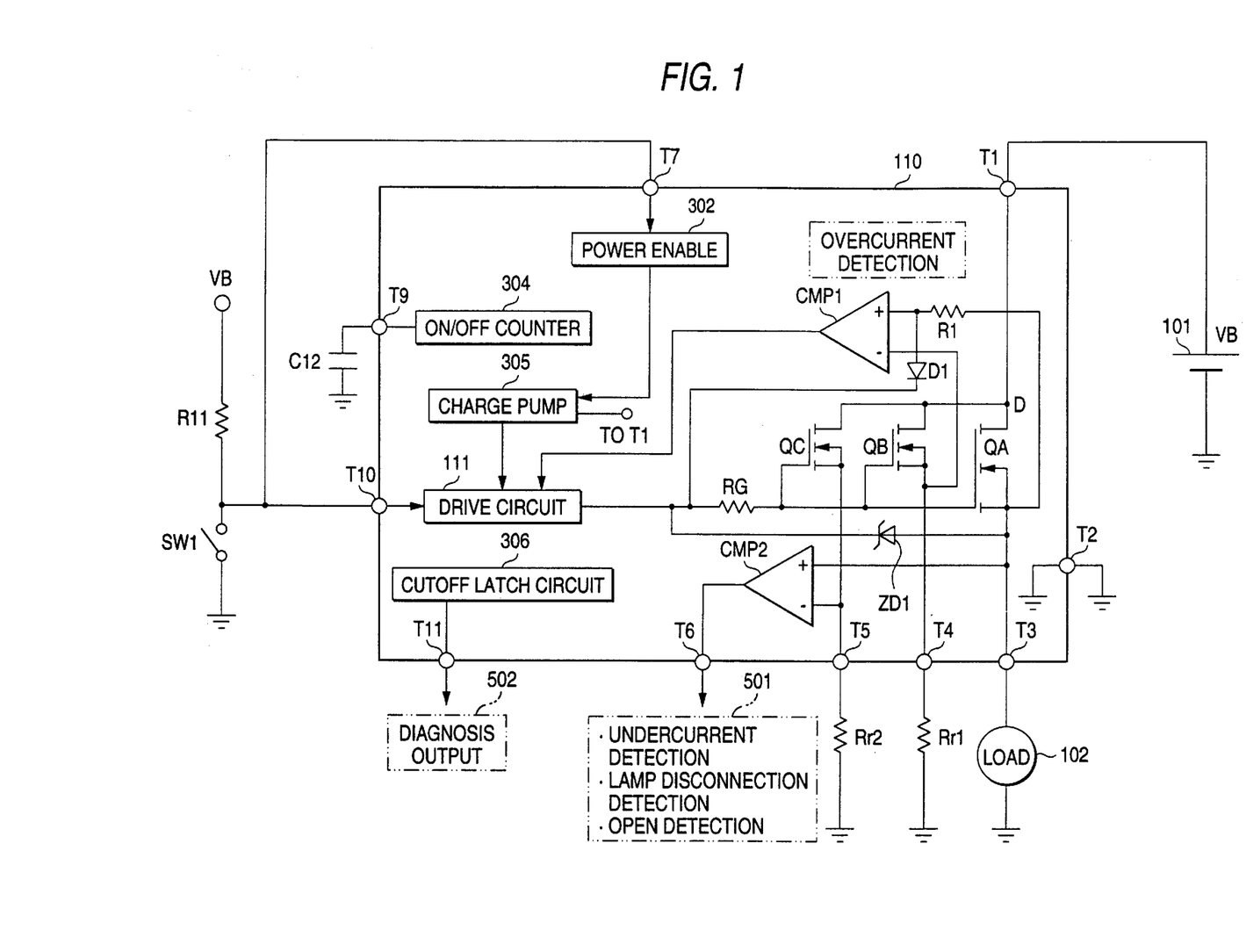
FIG. 1 is a block diagram of an embodiment of the switching device with a current-oscillating type circuit-breaking function which shows the basis of the present invention.

As shown in FIG. 1, the switching device with a current-oscillating type circuit-breaking function is configured as a semiconductor integrated circuit (power IC) in which various circuit elements are integrated on a semiconductor chip 110. A power supply terminal T1 is connected to a power supply 101 with an output voltage VB (e.g., +12 volts), a grounding terminal T2 is grounded, and output terminal T3 is connected to a load 102.

An n-channel FET QA with a built-in temperature sensor is integrated on the semiconductor chip 110 as a semiconductor device (power device) having a heat-sensitizing circuit-breaking function. The FET QA with a built-in temperature sensor has a drain electrode connected to the power supply 101 through a drain terminal D and the power supply terminal T1, a source electrode connected to the load 102 through the output terminal T3, and a gate electrode connected to a drive circuit 111 through a gate terminal TG and a resistor RG. The FET QA with a built-in temperature sensor serves as a first switching unit which is inserted in a power supply circuit connecting the power supply 101 and the load 102 and conducts (switches on) in response to a drive signal (on-pulse signal) inputted to the gate terminal TG so as to close the power supply circuit. N-channel FETs QB and QC are integrated as reference devices in parallel with the FET QA with a built-in temperature sensor.

The FET QB has a drain electrode connected to the power supply 101 through the drain terminal D and the power supply terminal T1, a source electrode connected to a first reference resistor Rr1 through an output terminal T4, and a gate electrode connected to the resistor RG through the gate terminal TG. The FET QC has a drain electrode connected to the power supply 101 through the drain terminal D and the power supply terminal T1, a source electrode connected to a second reference resistor Rr2 through an output terminal T5, and a gate electrode connected to the resistor RG through the gate terminal TG. The FET QB serves as a second switching unit which conducts in response to the drive signal (on-pulse signal) inputted to the gate terminal TG so as to close a shunt circuit connecting the power supply terminal T1 and the first reference resistor Rr1. The FET QC serves as a third switching unit which conducts in response to the drive signal (on-pulse signal) inputted to the gate terminal TG so as to close a shunt circuit connecting the power supply terminal T1 and the second reference resistor Rr2.

As the FETs QA, QB, and QC, it is possible to use power MOSFETs of, for example, a double diffusion MOS (DMOS) structure, a V-grooved MOS (VMOS) structure, or a U-grooved MOS (UMOS) structure, or MOSFETs having similar structures, and it is also possible to use MOS-combining type devices such as ESTs and MOS-controlled thyristors (MCTs) or other insulated-gate type power devices such as insulated gate drive bipolar transistors (IGBTs). Further, junction type FETs, junction type SITs or SI thyristors may be used if those are operated in a state that their gates are always reverse biased. Furthermore, as the FETs QA, QB, and QC used for the power IC, either the n-channel type or the p-channel type may be used.

In addition, the FET QA with a built-in temperature sensor, FET QB, and FET QC are configured by using, for instance, power devices of multi-channel structure in which a plurality of unit cells are connected in parallel, and the FETs are arranged adjacent to each other. The current capacities of the FETs QB and QC are set to be smaller than the current capacity of the FET QA. This setting is adjusted by the number of parallel-connected unit cells which make up the FETs QB and QC. For example, the configuration provided is such that the number of unit cells of the FET QA is 1,000 where the number of unit cells of the FET QB is 1, and the ratio between the channel widths W of the FET QB and the FET QA is set to be 1:1,000, for example.

Further, the source terminal S of the FET QA is connected to plus input terminals of a comparator CMP1 and a comparator CMP2, respectively; the source electrode of the FET QB is connected to a minus input terminal of the comparator CMP1; and the source electrode of the FET QC is connected to a minus input terminal of the comparator CMP2. An output terminal of the comparator CMP1 is connected to the drive circuit 111, and an output terminal of the comparator CMP2 is connected to an abnormality detecting unit 501 for effecting undercurrent detection, lamp disconnection detection, and open detection through an output terminal T6 of the semiconductor chip 110. Incidentally, the source terminal S of the FET QA is connected to the drive circuit 111 through a zener diode ZD1, and this zener diode is disposed so as to maintain the voltage between the gate terminal TG and the source terminal S of each of the FET QA, the FET QB, and the FET QC and to bypass an overvoltage when the overvoltage is applied to the gate terminal TG.

Meanwhile, a power enable portion 302, an on/off counter circuit 304, a charge pump circuit 305, and a cutoff latch circuit 306 (see Unexamined Japanese Patent Publication No. Hei. 6-244414) are integrated on other regions of the semiconductor chip 110. The power enable portion 302 is connected to a terminal T7, the on/off counter circuit 304 is connected to a capacitor C12 through a terminal T9, the drive circuit 111 is connected to a switch SW1 and a resistor R11 through an input terminal T10; and the cutoff latch circuit 306 is connected to a diagnosis output unit 502 through an output terminal T11.

It should be noted that the diagnosis output unit (diagnosis result output unit) 502 and its accompanying terminal T11 need not be provided.

Figure 2:
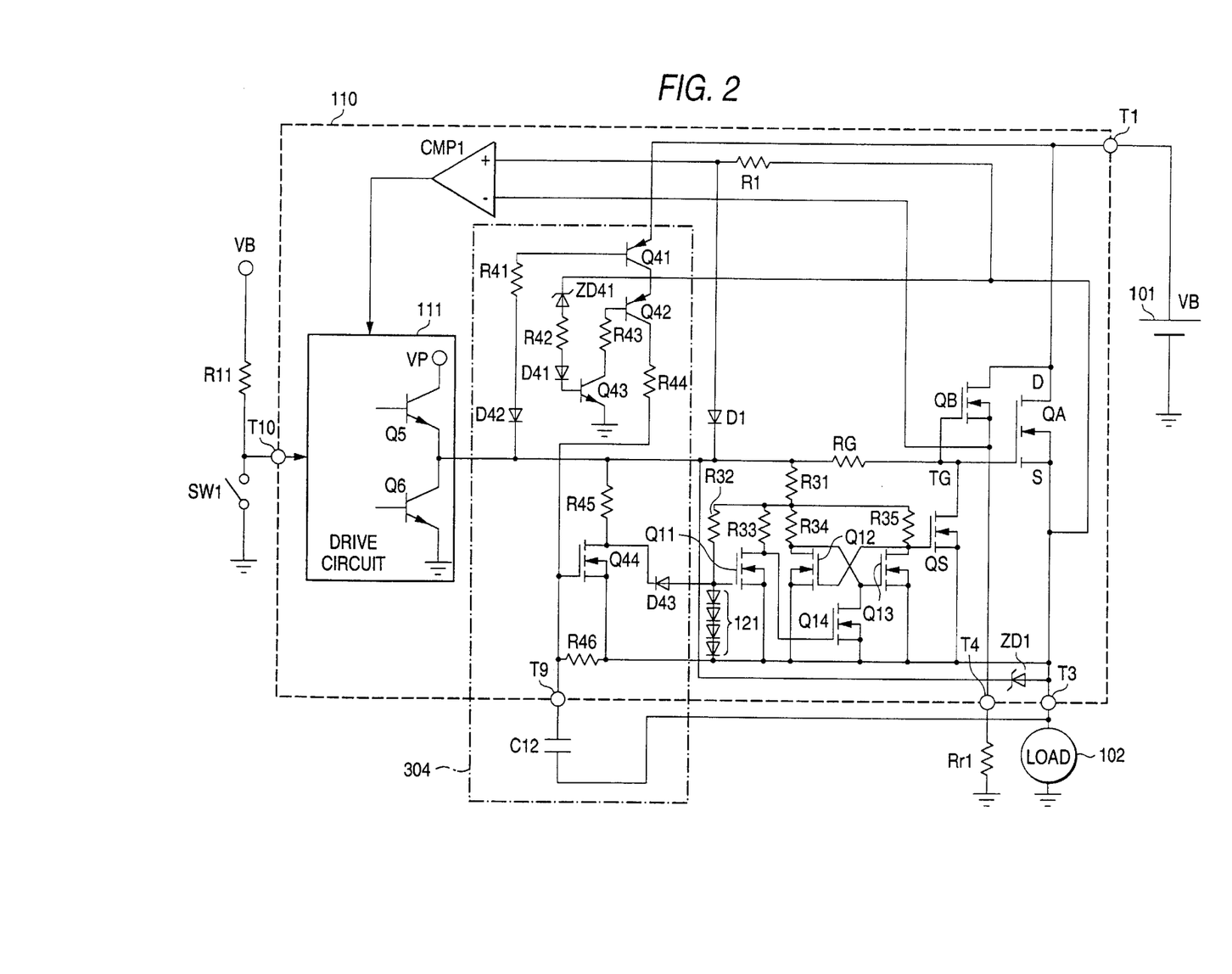
FIG. 2 is a circuit diagram of essential portions of the switching device shown in FIG. 1.

As shown in FIG. 2, the drive circuit 111 has a source transistor Q5 and a synchronous transistor Q6, and has drive elements and inverters for on-off control of the respective transistors. The transistors Q5 and Q6 are connected in series. The collector of the source transistor Q5 is connected to a terminal at a potential VP, and the emitter thereof is connected to the gate terminal TG through the resistor RG.

The collector of the synchronous transistor Q6 is connected to the gate terminal TG through the resistor RG, while the emitter thereof is connected to ground potential (GND). The terminal at potential VP is connected to the charge pump circuit 305, and by the output of the charge pump circuit 305 the potential VP of this terminal is set to a voltage higher than that at the power supply 101, e.g., 12V+10V if the voltage at the power supply 101 is 12V.

The drive circuit 111 serves as a driving device in which, when the switch SW1 is thrown and the input terminal T10 is grounded through the switch SW1, the source transistor Q5 is turned on in response to a command signal from the input terminal T10, thereby outputting a high-level drive signal (on-pulse signal) to the output terminal (the point of contact between the transistor Q5 and the transistor Q6). Meanwhile, when the switch SW1 is opened, since the voltage from the power supply 101 is applied to the input terminal T10 through the resistor R11, the synchronous transistor Q6 is turned on, thereby shifting the level of the output terminal (the point of contact between the transistor Q5 and the transistor Q6) to a low level. Incidentally, the drive circuit 111 may be configured by using a CMOSFET instead of a bipolar transistor.

Figures 3A, 3B:
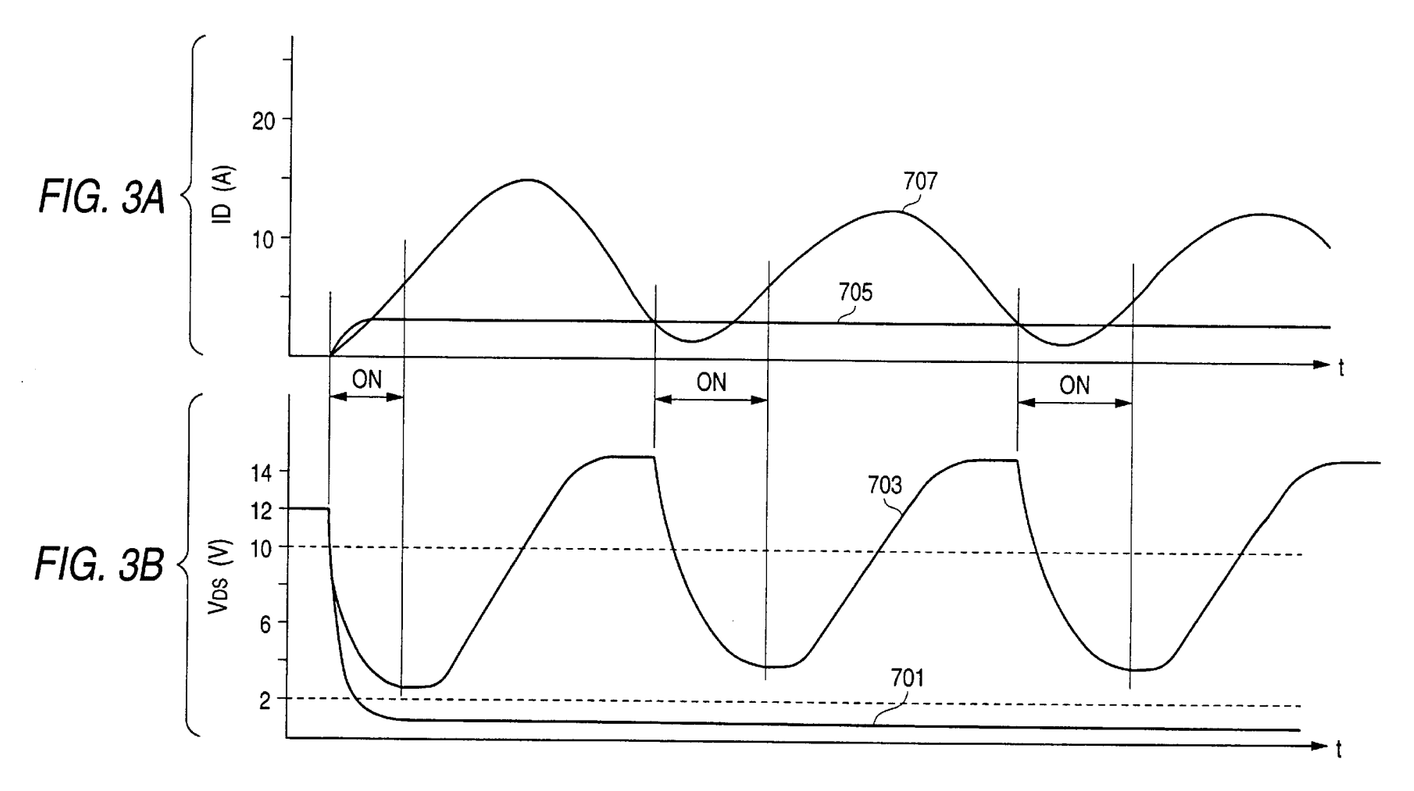
FIG. 3A is a waveform diagram of a load current for explaining the operation of the switching device shown in FIG. 1.
FIG. 3B is a waveform diagram of voltage across drain and source terminals of a FET QA.

When the drive signal (on-pulse signal) from the drive circuit 111 having the above-described configuration is inputted to the gate terminal TG, the FETs QA, QB, and QC conduct, and a voltage 701 between the drain and source electrodes of each FET drops to 2V or less, as shown in FIG. 3. At this time, when the load 102 is in a normal state, the voltage between the drain and source electrodes of each FET is maintained at 2V or less while the drive signal is being outputted from the drive circuit 111, and a drain current 705 at the FET QA is fixed.

Here, if the load 102 or the like becomes short-circuited, a large current flows across the load 102 or the like, so that there is a possibility of the load 102 and the FET QA becoming damaged. Accordingly, an arrangement is adopted in which the source voltages of the FETs QA and QB are monitored by the comparator CMP1, and drive circuit 111 is forcibly stopped from outputting the drive signal when the two voltages have exceeded a threshold level.

Namely, the source voltage of the FET QA is inputted to the plus input terminal of the comparator CMP1, while the source voltage of the FET QB is inputted to its minus input terminal. The comparator CMP1 compares the voltages inputted to its plus input terminal and minus input terminal, and outputs the "H" level output signal when the source voltage of the FET QA is higher than or substantially equal to the source voltage of the FET QB, whereas, when the source voltage at the FET QA has become lower than the source voltage of the FET QB, i.e., when a current larger than normal has flowed across the load 102 and the source voltage of the FET QA has become lower than the source voltage of the FET QB due to the first reference resistor Rr1, i.e., the threshold voltage, then the comparator CMP1 outputs the "L" level output signal to the drive circuit 111 by assuming that an abnormal current has flowed across the FET QA. When the "H" level signal is being inputted from the comparator CMP1, the drive circuit 111 is able to output the drive signal; however, when the "L" level signal is inputted, the drive circuit 111 is forcibly stopped from outputting the drive signal. Thus, the comparator CMP1 serves as a first abnormality determining device which forcibly stops the drive circuit 111 from outputting the drive signal. It should be noted that if it is assumed that the resistance of the load is L, that the current value to be detected which flows across the load due to an abnormality is $\alpha$ times the current value at normal times, and that the ratio in the number of units of the FET QB and the FET QA, i.e., the ratio between the channel widths W, is 1:N, the threshold voltage is determined by setting the resistance value of the reference resistor Rr1 to $N \cdot L/\alpha$.

As for the comparator CMP2 as well, the source voltage from the FET QA is inputted to its plus input terminal, while the source voltage from the FET QC is inputted to its minus input terminal. The comparator CMP2 compares the voltages inputted to its plus input terminal and minus input terminal, and outputs the "L" level output signal when the source voltage at the FET QA is lower than or substantially equal to the source voltage at the FET QC, whereas, when the source voltage at the FET QA is higher than the source voltage at the FET QC, i.e., when the load 102 consists of a plurality of electric bulbs, and a current smaller than normal has flowed due to the disconnection of one bulb, and when the source voltage at the FET QA has become higher than the source voltage at the FET QC due to the second reference resistor Rr2, i.e., the threshold voltage, then the comparator CMP2 outputs the "H" level output signal to the abnormality detecting unit 501 by assuming that an abnormal current has flowed across the FET QA. Thus, the comparator CMP2 serves as a second abnormality determining device which outputs the detection of the abnormality to the abnormality detecting unit 501. It should be noted that if it is assumed that the resistance of the load is L, that the current value to be detected which flows across the load due to an abnormality is $1/\beta$ times the current value at normal times, and that the ratio in the number of units of the FET QB and the FET QA, i.e., the ratio between the channel widths W, is 1:N, the threshold voltage is determined by setting the resistance value of the reference resistor Rr2 to $\beta \cdot N \cdot L$.

On the other hand, when the FET QA shifts from the on state to the off state, the transistor Q6 is turned on, causing a diode D1 to conduct. As a result, a current flows in the path of the resistor R1 and the diode D1, so that the potential at the plus input terminal of the comparator CMP1 drops to a level lower than when the drive circuit 111 is performing on-control. Accordingly, the FET QA is maintained in the off state immediately after the shift to the off state until a predetermined small difference arises in the drain-source voltage, i.e., until the source voltage of the FET QA becomes substantially equal to the source voltage at the FET QB.

However, even in the case where the FET QA is set in the off state due to such as a shortcircuiting of the wiring, the drain current increases, and the FET QA shifts to the off state after going through a pinchoff region, e.g., after undergoing the operational state in a triode characteristic region. Consequently, the potential at the plus input terminal of the comparator CMP1 becomes high after the lapse of a fixed time, so that the output level of the comparator CMP1 changes from the "L" level to the "H" level, causing the FET QA to shift to the on state again. As shown in FIG. 3, such a periodic transition of a drain-source voltage 703 of the FET QA during the occurrence of an abnormality due to such as the shortcircuiting of the load 102 continues while the switch SW1 is being closed, with the result that a drain current 707 of the FET QA periodically changes. The period of the transition of the drain-source voltage 703 of the FET QA is determined by a time constant based on, for example, the inductance of the wiring, the wiring resistance, of the capacitor capacity of the FET QA.

Accordingly, the number of times the FET QA is turned on and off is counted, and when this discrete value has reached a set value, the FET QA is forcibly cut off, and this cut-off state is held.

Specifically, the on/off counter circuit 304 and the cutoff latch circuit 306 are provided for counting the on-off state of the FET QA.

As shown in FIG. 2, the on/off counter circuit 304 comprises bipolar transistors Q41, Q42, and Q43, an n-channel FET Q44, diodes D41, D42, and D43, a zener diode ZD41, and resistors R41 to R46.

The cathode side of the zener diode ZD41 is connected to the source terminal S of the FET QA, and when the voltage at the source terminal S is in a normal state, a forward bias voltage is applied to the base of the transistor Q43, so that the transistor Q43 is in the on state. For this reason, the transistor Q42 is also in the on state. Meanwhile, since the transistor Q41 has its base connected to the output terminal of the drive circuit 111 through the resistor R41 and the diode D42, when the transistor Q5 is on, i.e., when the FET QA is on, the transistor Q41 is in the off state.

On the other hand, when the transistor Q6 is turned on, i.e., when the FET QA is turned off, since the diode D42 is grounded through the transistor Q6, the transistor Q41 is turned on. If the transistor Q41 is turned on, the current from the power supply 101 flows to the capacitor C12 through the transistors Q41 and Q42 and the resistor R44, so that the capacitor C12 is charged.

Next, when the transistor Q5 shifts from the off state to the on state, the transistor Q41 is turned off, and the charge built up in the capacitor C12 is discharged through the resistor R46. Subsequently, when the transistor Q6 is turned on again, and the transistor Q41 is turned on, the capacitor C12 is further charged.

In such a process in which the on-off action is repeated, if the gate voltage at the FET Q44 exceeds a threshold level due to the charge built up in the capacitor C12, the FET Q44 is turned on, causing the diode D42 to conduct. Consequently, both ends of a temperature sensor 121 are shortcircuited through the diode D43, and a latch command signal is outputted to the cutoff latch circuit 306. Namely, the on/off counter circuit 304 serves as a latch commanding device. Incidentally, the time period until the frequency of on-off action reaches a set value can be adjusted by a time constant based on the resistor R46 and the capacitor C12.

The cutoff latch circuit 306 comprises n-channel FETs QS, Q11, Q12, Q13, and Q14, the temperature sensor 121, and resistors R31 to R35, and the FET QS has its drain electrode connected to the gate terminal TG of the FET QA and its source electrode connected to the source terminal S of the FET QA. The temperature sensor 121 includes four diodes connected in series, and is arranged such that when the temperature of the semiconductor chip 110 has exceeded a set temperature, the voltage at its ends becomes lower than a set voltage. Namely, at normal times, the voltage at both ends of the temperature sensor 121 is set to be higher than the threshold level of the voltage between the source and gate electrodes of the FET Q11, and the FET Q11 is maintained in a normally on state. Then, when the FET Q11 is on, the FET Q14 is maintained in the off state, the FET Q13 is maintained in the on state, and the FETs Q12 and QS are maintained in the off state.

Meanwhile, when the FET Q44 is turned on and both ends of the temperature sensor 121 are shortcircuited through the diode D43, or the temperature of the semiconductor chip 110 has exceeded a set temperature and the voltage at both ends of the temperature sensor 121 has dropped to a level below a set voltage, the FET Q11 shifts from the on state to the off state, and the FET Q14 is turned on. If the FET Q14 is turned on, the FET Q13 is turned on and the FET QS is also turned on, with the result that the source and gate electrodes of the FET QA are short circuited by the FET QS, and the FET QA is set in the cutoff state. This short circuited state is latched by the FETs Q12 and Q13 serving as the latch circuit. Namely, the cutoff latch circuit 306 serves as a cutoff latch device which sets the FET QA in a nonconducting state and latches this nonconducting state when the frequency of the on-off action counted by the on/off counting circuit 304 has reached a set value, or when the temperature of the semiconductor chip 110 detected by the temperature sensor 121 has exceeded a set temperature due to heating by the current 707 (current oscillation) which periodically changes as described above.

Figure 4:
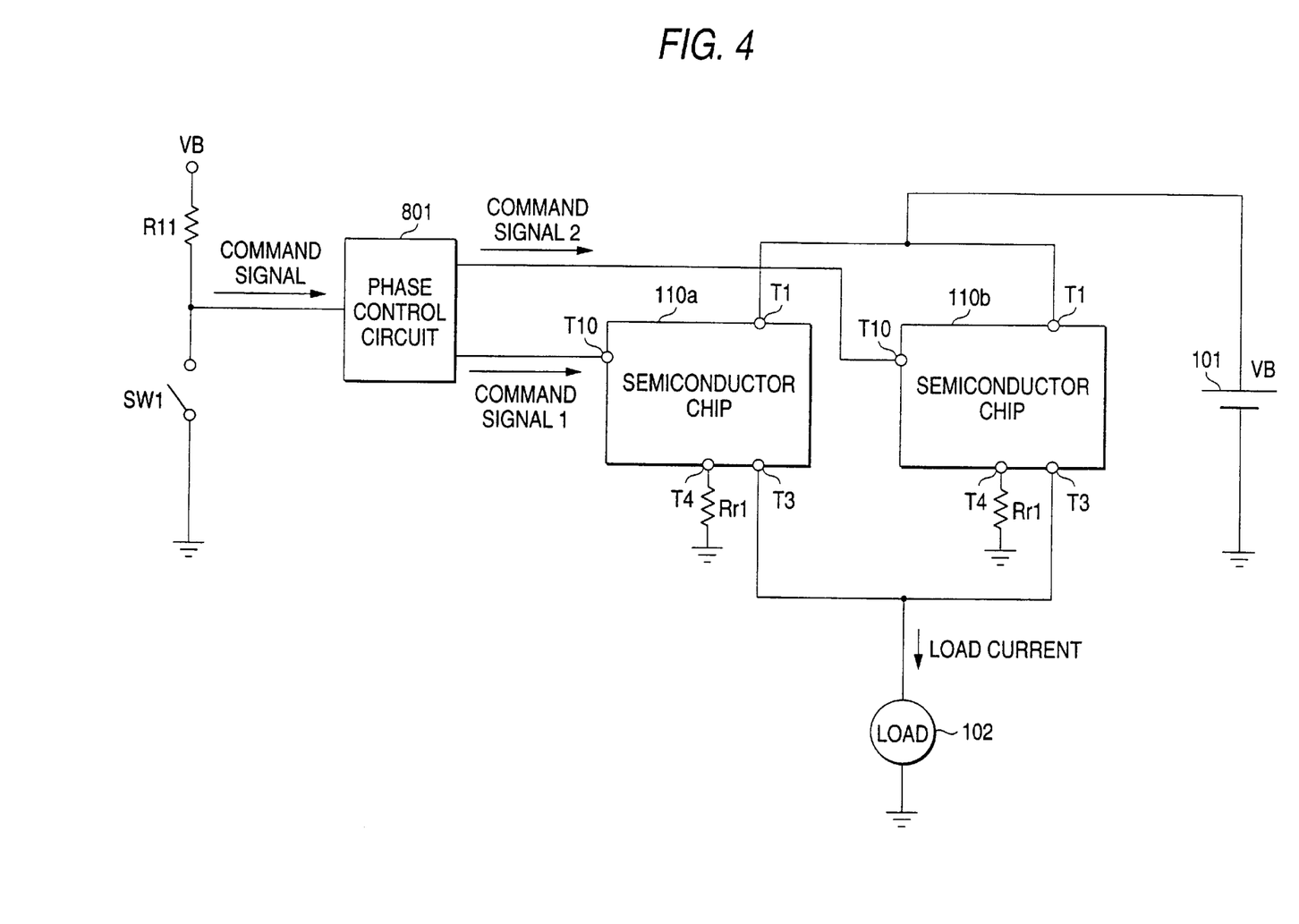
FIG. 4 is a block diagram of the switching device in accordance with another embodiment of the present invention.
Figure 5:
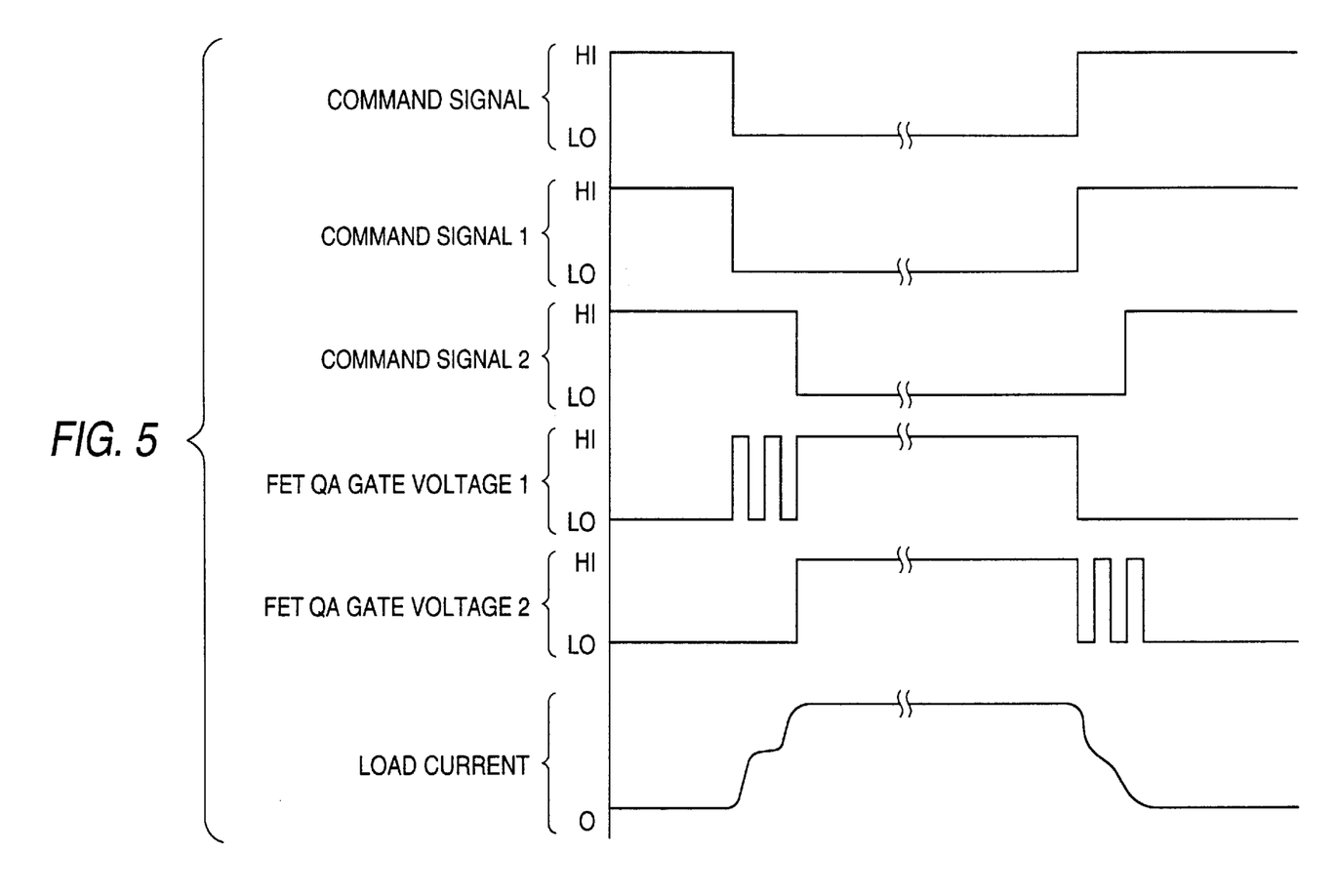
FIG. 5 is a diagram illustrating the states of command signal voltages, FET QA gate voltages, and a load current.

Next, referring to FIGS. 1, 3, 4, and 5, a description will be given of another embodiment of the switching device to which the present invention is applied, as well as characteristic portions of the present invention. FIG. 4 is a block diagram of the switching device in accordance with the embodiment. FIG. 5 is a diagram illustrating the states of command signal voltages, FET QA gate voltages, and a load current. As shown in FIG. 4, the switching device in this embodiment includes a phase control circuit 801, two semiconductor chips 110a and 110b which are switching units, etc. The phase control circuit 801 receives as its input the command signal from the switch SW1, shifts its phase, and outputs two command signals having different phases to the terminals T10 of the semiconductor chips 110a and 110b, respectively. The semiconductor chips 110a and 110b are basically the same as the semiconductor chip 110 shown in FIG. 1, and are connected in parallel between the power supply 101 and the load 102. However, since the breaking of current during the occurrence of an abnormality is not the object of this embodiment, the comparator CMP2, the FET QC, the on/off counter circuit 304, and the cutoff latch circuit 306 are unnecessary, and it is possible to use a semiconductor chip in which these components are made not to function or they are not provided. In addition, if it is assumed that the resistance of the load 102 is L, that the ratio in the number of units of the FET QB and the FET QA, i.e., the ratio between the channel widths W, is 1:N, and that the number of semiconductor chips 110 connected in parallel with the switching device is n, then it suffices if the resistance value of the reference resistor Rr1 is set to be substantially equal to or lower than N·L/n. In this embodiment, the resistance value of Rr1 is set to N·L/2, and a setting is provided such that the source voltage of the FET QA at a time when the current flowing across the FET QA of each semiconductor chip 110 when both semiconductor chips 110a and 110b are conducting, i.e., a ½ current of the current flowing across the load, has flowed across the FET QA becomes substantially equal to the source voltage of the FET QB. However, the conduction and nonconduction of the FET QA are repeated periodically when the comparator CMP1 compares the source voltages of the FET QA and the FET QB and the source voltage of the FET QA is lower than the source voltage of the FET QB, and this operation is similar to that of the above-described switching device which constitutes the basis of the present invention.

In the switching device of this embodiment, the command signal from the switch SW1 is inputted to the phase control circuit 801, and is converted to two command signals 1 and 2 having different phases, as shown in FIG. 5. For this reason, if the switch SW1 is closed, the low-level command signal 1 for commanding the driving of the load is inputted to the drive circuit 111 of the semiconductor chip 110a. In response to the low-level command signal 1 the drive circuit 111 outputs the drive signal to the FET QA, thereby setting the FET QA in a conducting state. At this time, the state is such that only the semiconductor chip 110a is conducting, and a current substantially equal to the current flowing across the load 102 flows across the FET QA of the semiconductor chip 110a, so that the source voltage of the FET QA becomes lower than the source voltage of the FET QB. For this reason, the outputting and stopping of the drive signal are repeated as described above, and as shown in FIG. 5, the gate voltage 1 of the FET QA periodically shifts between the high level and the low level, so that the conduction and nonconduction of the FET QA are periodically repeated. Hence, the state becomes similar to that of duty control, and the mean current of the load at this time becomes smaller than the steady-state current. Next, with a predetermined time lag, the low-level command signal 2 for commanding the driving of the load is inputted to the drive circuit 111 of the semiconductor chip 110b. In response to the low-level command signal 2 the drive circuit 111 outputs the drive signal to the FET QA, thereby setting the FET QA in the conducting state. At this time, since power is supplied to the load 102 from both the semiconductor chip 110a and the semiconductor chip 110b, the current flowing across the FETs QA of the semiconductor chips 110a and 110b becomes ½ of the load current. For this reason, the source voltage of the FET QA becomes substantially equal to the source voltage of the FET QB, and the semiconductor chip 110a stops the periodic repetition of conduction and nonconduction of the FET QA, with the result that the FETs QA of the semiconductor chips 110a and 110b are kept in the conducting state, and the load current is kept in the steady state. In other words, since the load current increases in steps, it is possible to suppress the rush current at the time of starting the driving of the load.

On the other hand, if the switch SW1 is opened, the high-level command signal 1 for commanding the stop of driving of the load is inputted to the drive circuit 111 of the semiconductor chip 110a. In response to the high-level command signal 1 the drive circuit 111 stops outputting the drive signal. At this time, the state is such that only the semiconductor chip 110b is conducting, and a current substantially equal to the current flowing across the load 102 flows across the FET QA of the semiconductor chip 110b, so that the source voltage of the FET QA becomes lower than the source voltage of the FET QB. For this reason, the outputting and stopping of the drive signal are repeated as described above, and as shown in FIG. 5, the gate voltage 2 of the FET QA periodically shifts between the high level and the low level, so that the conduction and nonconduction are periodically repeated. Hence, the state becomes similar to that of duty control, and the mean current flowing across the load becomes smaller than the steady-state current. Next, with a predetermined time lag, the high-level command signal 2 for commanding the stop of the driving of the load is inputted to the drive circuit 111 of the semiconductor chip 110b. In response to the high-level command signal 2 the drive circuit 111 stops outputting the drive signal, so that the FET QA is set in the nonconducting state, thereby stopping the supply of current to the load. In other words, since the load current decreases in steps, it is possible to suppress the rush current at the time of stopping the driving of the load.

As described above, with the switching device in accordance with this embodiment, it is possible to suppress the rush current by increasing or decreasing the load current in steps at the time of starting or stopping the driving of the load 102 by hardware circuits alone without using a controlling device such as a microcomputer. Further, most of the component elements such as the hardware circuits can be integrated on the semiconductor chips 110. In short, the switching device can be simplified.

In addition, although in this embodiment two semiconductor chips 110 are used, it is possible to use three or more semiconductor chips 110.

In addition, although the semiconductor chips 110 on each of which the drive circuit 111, the FET QA, the FET QB, the comparator CMP1, etc. are integrated are used, these individual functions need not be integrated on a single semiconductor chip, and may be configured by separate circuits or chips, the functions of the plurality of semiconductor chips 110 may be integrated on a single semiconductor chip.

What is claimed is:

1. A switching device, comprising:
a phase controlling device which outputs a plurality of phases of a command signal; and
a plurality of switching units connected in parallel between a power supply and a load, each of the plurality of switching units including:
   a driving device which outputs a drive signal in response to the command signal from the phase controlling device,
   a first semiconductor switch inserted in a power supply circuit connecting the power supply and the load, the first semiconductor switch being adapted to conduct in response to the drive signal,
   a resistor connected to the power supply to form a shunt circuit,
   a second semiconductor switch inserted in the shunt circuit, the second semiconductor switch being adapted to conduct in response to the drive signal, and
   a drive stopping device which compares an output voltage from the first semiconductor switch and an output voltage from the second semiconductor switch, and stops the driving device from outputting the drive signal when the output voltage from the second semiconductor switch is higher than the output voltage from the first semiconductor switch.

* * * * *